United States Patent [19]
Hayashi et al.

[11] Patent Number: 5,495,197
[45] Date of Patent: Feb. 27, 1996

[54] VARIABLE DELAY CIRCUIT

[75] Inventors: Yokichi Hayashi, Gunma; Hiroshi Tsukahara; Katsumi Ochiai, both of Gyoda; Masuhiro Yamada, Ashikaga; Naoyoshi Watanabe, Gyoda, all of Japan

[73] Assignee: Advantest Corporation, Japan

[21] Appl. No.: 394,249

[22] Filed: Feb. 24, 1995

Related U.S. Application Data

[62] Division of Ser. No. 253,216, Jun. 2, 1994, Pat. No. 5,440,260, which is a division of Ser. No. 924,520, Aug. 4, 1992, abandoned.

[30] Foreign Application Priority Data

| Aug. 14, 1991 | [JP] | Japan | 3-204365 |
| Nov. 8, 1991 | [JP] | Japan | 3-293230 |
| Nov. 8, 1991 | [JP] | Japan | 3-293231 |
| Nov. 8, 1991 | [JP] | Japan | 3-293232 |
| Nov. 8, 1991 | [JP] | Japan | 3-293233 |
| Nov. 29, 1991 | [JP] | Japan | 3-98755 U |

[51] Int. Cl.⁶ ................................. H03H 11/26
[52] U.S. Cl. ......................... 327/276; 327/261
[58] Field of Search ................ 326/52, 54, 55; 327/261, 263, 264, 266, 276, 278, 281, 283, 284, 285, 288, 290, 392–401

[56] References Cited

U.S. PATENT DOCUMENTS

| 4,694,208 | 9/1987 | Szabó et al. | 327/261 |
| 5,185,540 | 2/1993 | Boudry | 327/276 |
| 5,283,631 | 2/1994 | Koerner et al. | 327/393 |
| 5,294,848 | 3/1994 | Kannegundla | 327/261 |
| 5,352,945 | 10/1994 | Casper et al. | 327/261 |

Primary Examiner—Timothy P. Callahan
Assistant Examiner—Jeffrey Zweizig
Attorney, Agent, or Firm—Staas & Halsey

[57] ABSTRACT

First and second exclusive-OR gates (hereinafter referred to as EXOR gates) are provided, which are both connected at one input side to a delay input terminal. The other input side of the first EXOR gate is grounded and the other input side of the second EXOR gate is connected to a select signal input terminal. A capacitor is connected between the output side of the first EXOR gate and the output side of the second EXOR gate. The output side of the first EXOR gate is connected to a delay output terminal by way of a buffer which outputs logical levels. The buffer has a threshold value and outputs one or the other binary logical level depending on whether the input thereto is above or below a threshold value.

2 Claims, 4 Drawing Sheets

VARIABLE DELAY CIRCUIT

This application is a division, of application Ser. No. 08/253,216, filed Jun. 2, 1994, now U.S. Pat. No. 5,440,260, which is a division of application Ser. No. 07/924,520, filed Aug. 4, 1992, abandoned.

BACKGROUND OF THE INVENTION

The present invention relates to a fine variable delay circuit which is suitable for use as each of variable delay stages which are cascade-connected to form a variable delay circuit which is able to delay, for example, an input signal thereto for a desired period of time.

Generally speaking, CMOS logic circuits individually have inherent input-output delay times of their own depending on various conditions during manufacture. As compared with logic circuits formed by bipolar transistors, the CMOS circuits suffer their larger scattering delay time, and therefore, the use of such CMOS logic circuits for forming various circuits will lead to lack of a timing margin. A fine variable delay circuit is needed to correct variations in the input-output delay time of such a CMOS logic circuit.

FIG. 1A shows a conventional variable delay circuit formed by a plurality of cascade-connected variable delay stages to which the present invention is applicable. Variable delay stages 11, 12 and 13 are connected in series and the delay time of each stage is selectively variable by selecting one of two paths branched from its input under control of a multiplexer 14. In this example, the variable delay stage 11 has buffers 15 and 16 respectively provided in two paths, the variable delay stage 12 has one buffer 16 provided in only one of the two paths and the variable delay stage 13 has two series-connected buffers 16 provided in only one of the two paths. The propagation delay time Tpd of the buffer 16 is set to a value twice larger than the propagation delay time Tpd of the buffer 15. For instance, the buffer 15 may be formed by a series connection of two inverters, whereas the buffer 16 by a series connection of four inverters. By selective control of select signals $SEL_1$, $SEL_2$ and $SEL_3$ for the multiplexers 14 of the respective variable delay stages 11, 12 and 13, the path between an input terminal 17 and an output terminal 18 is changed for each stage, whereby delay times are 1, 2, ..., or 8 times as long as the propagation delay time Tpd of the buffer 15, respectively, are provided in this example.

In the case where a delay element 19 is provided in only one of the two paths in each of the variable delay stages 11, 12 and 13, as shown in FIG. 1B, the delays $d_1$, $d_2$ and $d_3$ of the delay elements 19 are A, 2A and 4A, respectively, where A is a minimum resolution desired to obtain. In the case of n variable delay stages being connected, the delay $d_n$ of the delay element 19 in the nth stage is $A2^{n-1}$.

With the prior art example depicted in FIG. 1A, it is difficult to raise or improve the resolution (i.e. to reduce the minimum variable step) partly because the delays of the buffers 15 and 16 are relatively large, for example, 200 to 500 pS and partly because the total propagation delay between the input and output terminals 17 and 18 consists in great part of a fixed delay. In other words, since the scattering of the delays of the buffers has an appreciable influence on the total propagation delay as a whole, it is difficult to raise the delay resolution within compensated scattering delay. In the case where the buffers 15 and 16 are fabricated as integrated circuits using CMOS's, the scattering of their delays is particularly large, making it more difficult to increase the resolution than in the case where bipolar transistors are used to form the buffers 15 and 16.

The circuit arrangement shown in FIG. 1B also utilizes the propagation delay of each delay element 19, which scatters due to varying conditions during manufacture, variations in the power supply voltage and ambient temperature and the scatter of the line capacity as well. Letting the delay resolution, i.e. the minimum variable step be represented by A, it is possible, ideally, that the nth variable delay stage selects the delay 0 or $A2^{n-1}$ and that the delays ranging from 0 to $A2^{n-1}$ are selectively set every step A at will by the variable delay circuit formed by a total of M variable delay stages. Accordingly, the following equation holds:

$$A2^{n-1}=A(2^0+2^1+ \ldots +2^{n-2})+A2^0.$$

In practice, however, the delays of the respective delay stages scatter. Now, let the scattering or dispersion ratio of delay in each delay element be represented by $\alpha$. In the worst case, there are the possibilities that the sum of delays in variable delay stages preceding a certain stage becomes minimum due to scattering and that the delay in that certain stage becomes maximum due to scattering, and even in such a case, the required delay resolution A must be secured. In the actual design of the variable delay circuit it is necessary, therefore, to predetermine the delays $d_1, d_2, \ldots$ of respective delay stages in anticipation of their scattering. That is, the delay $d_1$, which satisfies $(1+\alpha)d_1=A$, is determined for the first delay stage 11; the delay $d_2$, which satisfies $(1+\alpha)d_2= d_1(1-\alpha)+A$, and hence is equal to $2A/(1+\alpha)^2$, is determined for the second delay stage 12; and the delay $d_3$, which satisfies $(1+\alpha)d_3=(d_1+d_2)(1-\alpha)$, and hence is equal to $2A/(1+\alpha)^3$, is determined for the third delay stage 13. In the case where n delay stages are connected in cascade, the delay of the nth stage is $D_n=2^{n-1}\cdot A/(1+\alpha)^n$, taking the scatter of the delay into account.

Thus the influence of the delay scattering or dispersion ratio $\alpha$ increases as the last delay stage is approached and the delay becomes smaller than that $d_n=2^{n-1}\cdot A$ in the ideal case, making it impossible to enlarge the range over which the delay of each delay stage is variable. In the case of using a CMOS gate array to form the delay element, the ratio $\alpha$ is usually around 0.6, and since this is an appreciably large value, the circuit which provides the desired delay would become inevitably large-scale, and hence is impractical.

SUMMARY OF THE INVENTION

It is therefore an object of the present invention to provide a fine variable delay circuit whose delay does not largely scatter and can be varied with a relatively small step.

According to an aspect of the present invention, first and second exclusive-OR gates are used, which are connected at one input side to a common delay input terminal. The other input side of the first exclusive-OR gate is grounded and a capacitor is connected between the output side of the first exclusive-OR gate and the output side of the second exclusive-OR gate. The other input side of the second exclusive-OR gate is connected to a select signal input terminal, the input side of a buffer, which outputs a logical level, is connected to the output side of the first exclusive-OR gate, and the output side of the buffer is connected to a delay output terminal.

DESCRIPTION OF THE PREFERRED EMBODIMENT

Figure 2:
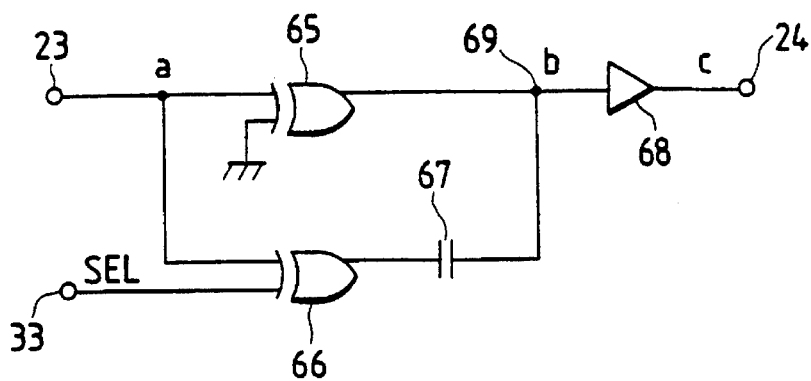
FIG. 2 is a logic circuit diagram illustrating another embodiment of the present invention.

FIG. 2 illustrates an embodiment of the fine variable delay circuit according to the aspect of the present invention. First and second exclusive-OR gates (hereinafter referred to as EXOR gates) 65 and 66 are provided, which are both connected at one input side to the delay input terminal 23, the other input side of the first EXOR gate 65 is grounded and the other input side of the second EXOR gate 66 is connected to the select signal input terminal 33. A capacitor 67 is connected between the output side of the first EXOR gate 65 and the output side of the second EXOR gate 66, and the output side of the first EXOR gate 65 is connected to the delay output terminal 24 via a buffer 68 which outputs logical levels. The buffer 68 has a threshold value and outputs one or the other of binary logical levels, depending on whether the input thereto is above or below the threshold value.

Figure 3A:
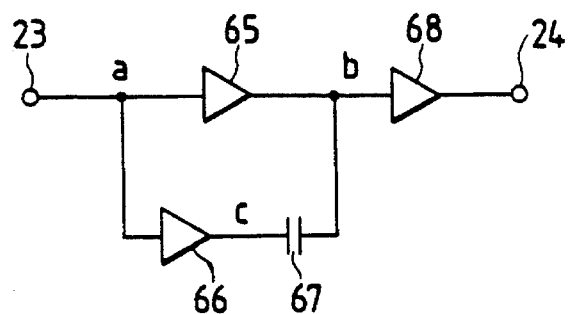
FIG. 3A is an equivalent circuit diagram of the FIG. 2 embodiment when the select signal SEL is "0"
Figure 3B:
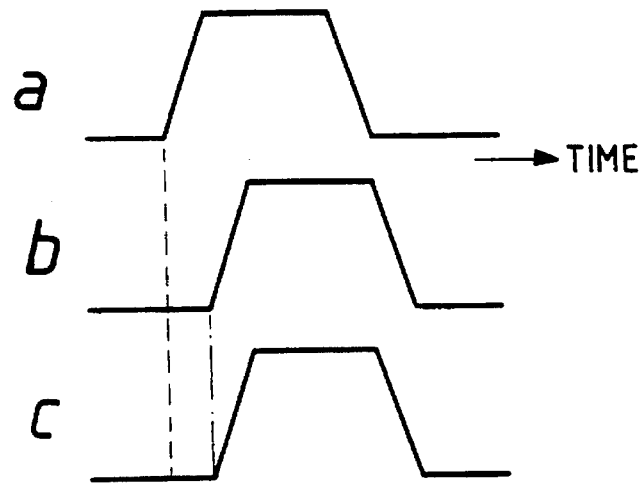
FIG. 3B is a diagram for explaining the operation of the circuit depicted in FIG. 3A.
Figure 3C:
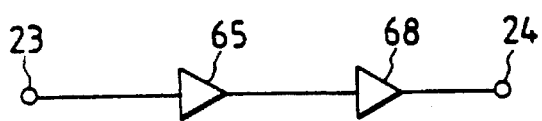
FIG. 3C is an equivalent circuit diagram of the FIG. 3A circuit.

With this arrangement, when the select signal SEL at the select signal input terminal 33 is at the 0-level, the second EXOR gate 66 becomes a non-inverting gate and the circuit of FIG. 21 is equivalent to a circuit shown in FIG. 3A. When a signal of a waveform depicted on Row a in FIG. 3B is applied to the input terminal 23, signals of the same waveform, as shown Rows b and c in FIG. 3B, simultaneously appear at the outputs of the first and second EXOR gates 65 and 66. Consequently, the potential across the capacitor 67 always remains unchanged and no current flows thereinto, hence the impedance of the capacitor 67 can be regarded as infinity. Accordingly, the second EXOR gate 66 can be neglected and the equivalent circuit of FIG. 2 can be expressed as shown in FIG. 3C.

Figure 4A:
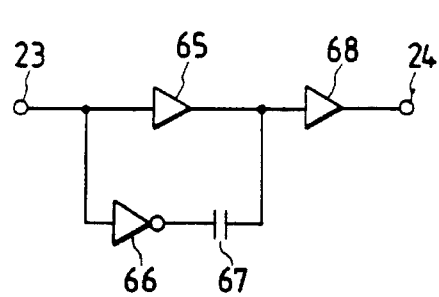
FIG. 4A is an equivalent circuit diagram of the FIG. 2 embodiment when the select signal SEL is "1"
Figure 4B:
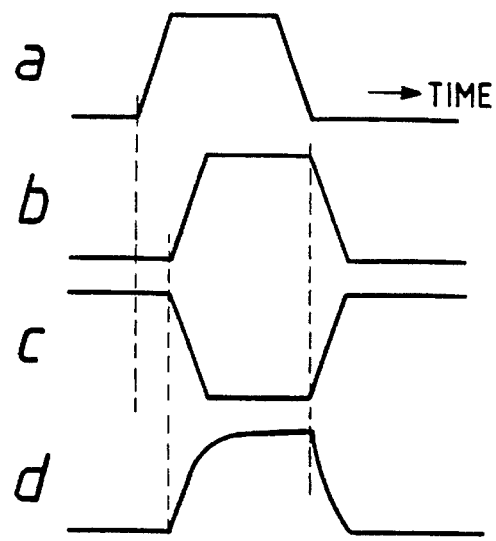
FIG. 4B is a waveform diagram for explaining the operation at respective parts in the circuit depicted in FIG. 4A.
Figure 4C:
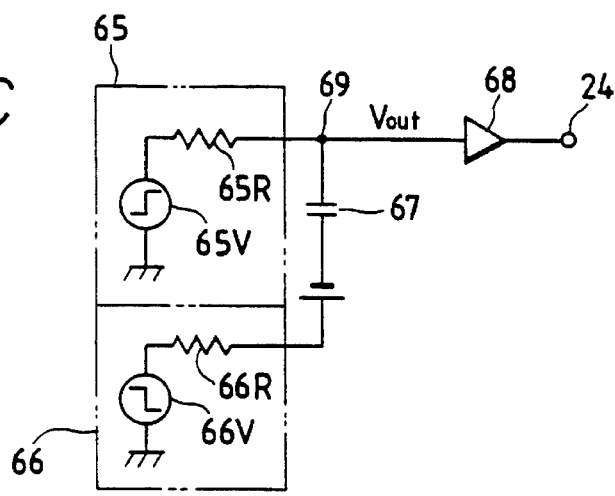
FIG. 4C is an equivalent circuit diagram of the circuit depicted in FIG. 4A.

On the other hand, when the select signal SEL at the select signal input terminal 33 is at the 1-level, the second EXOR gate 65 acts as an inverting gate and the circuit of FIG. 2 can be expressed as shown in FIG. 4A. When a signal of the waveform depicted on Row a in FIG. 4B is applied to the input terminal 23, the output from the first EXOR gate 65 in the case where it is assumed that the second EXOR gate 66 is not provided has the same polarity as the input waveform as shown on Row b in FIG. 4B and the output from the second EXOR gate 66 becomes opposite in polarity to the output depicted on Row b in FIG. 4B, as shown on Row c in FIG. 4B. Representing the first and second EXOR gates 65 and 66 by voltage sources 65V, 66V and output resistances (ON resistances of the gates) 65R, 66R, the circuit of FIG. 4A becomes such an equivalent circuit depicted in FIG. 4C. The following 180° out-of-phase voltages $v_1(t)$ and $v_2(t)$ are output from the voltage sources 65V and 66V.

$v_1(t)=v_0 f(t)$, $v_2(t)=v_0(1-f(t))$ where $f(t)=0$ for $t \leq 0$, $f(t)=1$ for $t \leftarrow \infty$, and $0 \leq f(t) \leq 1$.

A voltage $V_{out}(s)$ at the connection point 69 of the first EXOR gate 65 and the capacitor 67 is expressed as follows:

$$V_{out}(s) = V_0 \cdot F(s) - \frac{V_0 F(s) - \{V_0(1/s - F(s)) - V_0/s\}}{(2R + 1/sC)} R \quad (3)$$

$$= \frac{V_0 \cdot F(s)(1/2CR)}{s + 1/(2CR)}$$

where R is the value of each of the output resistances 65R and 66R and C is the capacity of the capacitor 67.

Setting $f(t)=u(t)$ (a unit step pulse), $$V_{out}(t) = V_0 \frac{1/2CR}{s(s + 1/2CR)} \quad (4)$$

$$= V_0\{1 - \exp(-t/2CR)\}$$

The time for the voltage $v_{out}(t)$ to reach the value $V_0/2$ is $2CR\log 2$.

Figure 4D:
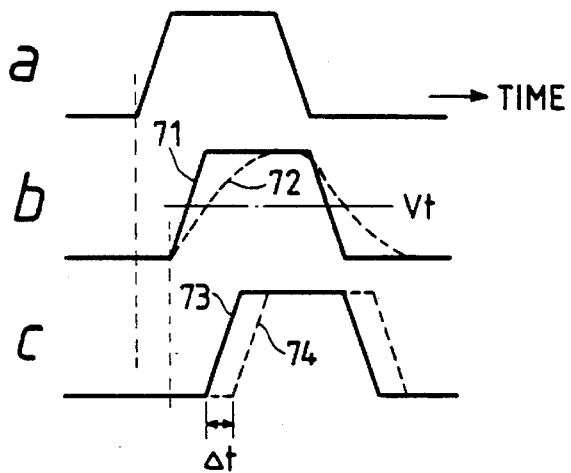
FIG. 4D is a waveform diagram for explaining the operation of the circuit shown in FIG. 4C.

The waveform of the output signal at the connection point 69 is dull in its rise and fall as shown on Row d in FIG. 4B. Consequently, when the signal of the waveform depicted on Row a in FIG. 4D is applied to the delay input terminal 23 in FIG. 4A, if the select signal SEL is at the 0-level, the signal at the connection point 69 becomes identical in waveform with the input signal as indicated by the solid line 71 on Row b in FIG. 4D, but if the select signal SEL is at the 1-level, the signal waveform at the connection point 69 becomes dull in its rise and fall as indicated by the broken line 72 on Row b in FIG. 4D. When the threshold level Vt of the buffer 68 is intermediate between the low and high levels as shown on Row b in FIG. 4D, if the select signal SEL is at the 0-level, the output of the buffer 68 becomes such as indicated by the solid line 73 as shown on Row c in FIG. 4D, whereas when the select signal SEL is at the 1-level, the output of the buffer 68 is delayed by $\Delta t=2CR\log 2$ as indicated by the broken line 74.

It is easy to fabricate the entire circuit structure of FIG. 2 as an integrated circuit and to lessen the influence of wiring, and hence the delay difference $\Delta t$ desired to obtain can easily be accomplished. This delay difference $\Delta t$ can readily be made on the order of 20 to 40 pS, for instance. By connecting in cascade a plurality of such fine variable delay circuits as shown in FIG. 2 and by changing the combination of the select signals for each variable delay circuit to cause the input signal to follow various routes, it is possible to selectively set any one of a plurality of delays which have delay differences $\Delta t$, $2\Delta t$, $3\Delta t$, $4\Delta t$, ... with respect to the minimum delay.

Figure 5A:
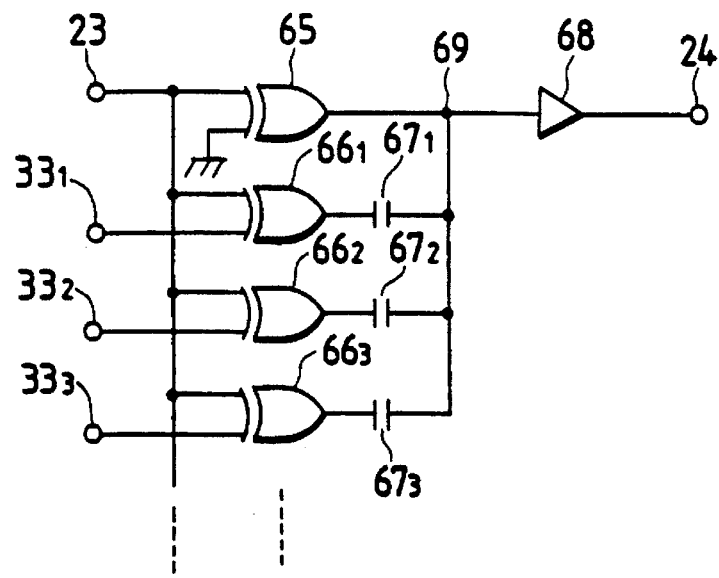
FIG. 5A is a logic circuit diagram illustrating still another embodiment of the present invention.
Figure 5B:
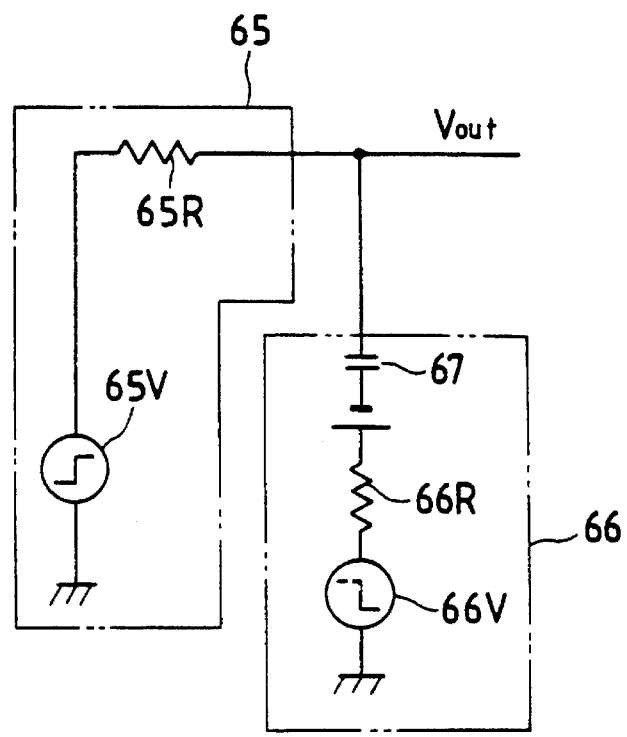
FIG. 5B is an equivalent circuit diagram of the FIG. 5A embodiment.

It is also possible to employ such a construction as shown in FIG. 5A wherein a plurality of second EXOR gates $66_1$, $66_2$, $66_3$, ... are provided and are connected at one input side to the delay input terminal 23 in common to them and connected at the other input side to individual select signal input terminals $33_1$, $33_2$, $33_3$, ..., respectively, and connected at the output side to the output side of the first EXOR gate 65 via individual capacitors $67_1$, $67_2$, $67_3$, ..., respectively. Assuming that the capacities of the capacitors $67_1$, $67_2$, $67_3$, ... have the same value C, if n of select signals $SEL_1$, $SEL_2$, $SEL_3$, ... at the select signal input terminals $33_1, 33_2, 33_3, \ldots$ are at the 1-level, the circuit of FIG. 5A can be expressed by such an equivalent circuit depicted in FIG. 5B as is the case with FIG. 5C. In this instance, since the capacitance 67 is nC and since the output resistance 66R is R/n, the voltage $V_{out}(s)$ at the connection point 69 is given by the following equation:

$$V_{out}(s) = V_0 \cdot F(s) - \frac{V_0 F(s) - \{V_0(1/s - F(s)) - V_0/s\}}{(R + R/n + 1/nsC)} R \quad (5)$$

Substitution of $V_1(s) = V_0 \cdot F(s)$, $V_2(s) = V_0(1/s - F(s))$, $V_2(0) = V_0$, $F(s) = 1/s$ (unit step pulses) into Eq. (5) gives $$V_{out}(s) = V_0 \left[ \frac{\frac{2n}{1+n} \cdot \frac{1}{(1+n)CR}}{s \left\{ s + \frac{1}{(1+n)CR} \right\}} + \frac{\frac{1-n}{1+n}}{s} \right] \quad (6)$$

and $$v_{out}(t) = v_0 \left\{ 1 - \frac{2n}{1+n} \exp\left[ -\frac{1}{(1+n)CR} \right] \right\} \quad (7)$$

The time for the voltage $v_{out}(t)$ to reach $V_0/2$ becomes as follows:

$$t = -(n+1)CR \log(n+1)/4n \quad (8)$$

Thus, the delay can be varied monotonically in accordance with the value n.

Figure 1A:
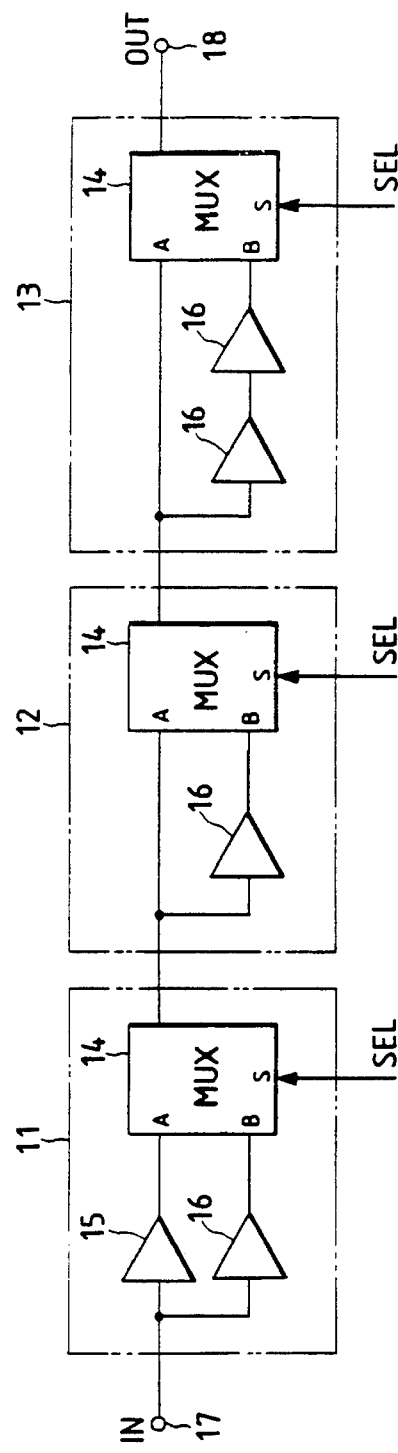
FIG. 1A is block diagram showing a conventional multistage variable delay circuit.

If four second EXOR gates are used in FIG. 5A, then the circuit performs the same function obtainable with two delay stages in the conventional circuit of FIG. 1A. In the above embodiment the first and second EXOR gates 65 and 66 and the buffer 68 are formed by CMOSFETs, for instance.

As described above, according to this embodiment, the delay of the input signal can be changed by the construction in which at least one second EXOR gate is connected in parallel to a first EXOR gate via a capacitor at the output side of the former, a select signal is applied to the other input side of the second EXOR gate and the select signal is made a "0" or "1." It is easy to obtain delays which changes at intervals of 20 to 40 pS, for example; hence a fine variable delay circuit of less scattering delay can be obtained.

Figure 1B:
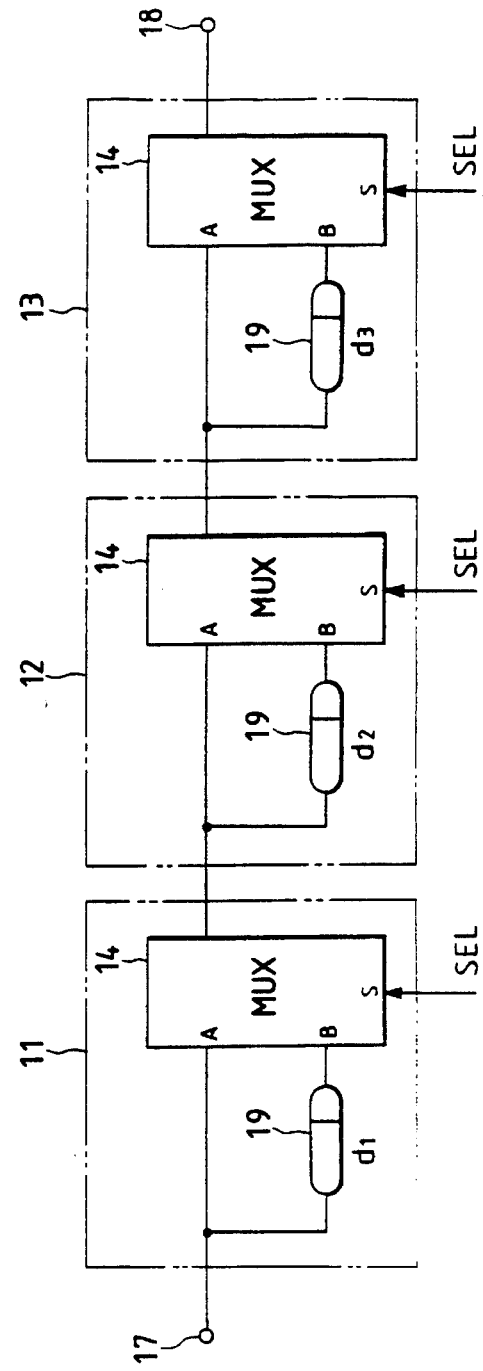
FIG. 1B is a block diagram showing another conventional multistage variable delay circuit.

The above-described embodiments, that is, the circuits shown in FIGS. 2 and 5A may be used as independent variable delay circuit or as individual delay stages in such a multistage connection as shown in FIGS. 1A and 1B. Moreover, FETs are used as transistors in the embodiments but bipolar transistors can be employed.

It will be apparent that many modifications and variations may be effected without departing from the scope of the novel concepts of the present invention.

What is claimed is:

1. A fine variable delay circuit comprising:
   a first exclusive-OR gate grounded at one input side and connected at another input side to a delay input terminal;
   a second exclusive-OR gate connected at one input side to a select signal input terminal and at another input side to said delay input terminal;
   a capacitor connected between an output side of said first exclusive-OR gate and an output side of said second exclusive-OR gate; and
   a buffer connected at an input side to the connection point of said capacitor and said output side of said first exclusive-OR gate and at an output side to a delay output terminal, said buffer outputting a logical level.

2. The fine variable delay circuit of claim 1 wherein a plurality of pairs of second exclusive-OR gates and capacitors are provided.

* * * * *

UNITED STATES PATENT AND TRADEMARK OFFICE
CERTIFICATE OF CORRECTION

PATENT NO. : 5,495,197
DATED : February 27, 1996
INVENTOR(S) : Yokichi HAYASHI et al.

It is certified that error appears in the above-indentified patent and that said Letters Patent is hereby corrected as shown below:

Column 1, line 3, delete "," (comma).

Column 3, line 48, change "Fig. 21" to --Fig. 2--.

Column 4, line 64, after "$67_3$, . . ." insert

--,-- (comma); and line 65, delete "," (comma).

Signed and Sealed this

Twenty-fifth Day of June, 1996

Attest:

BRUCE LEHMAN

*Attesting Officer*       *Commissioner of Patents and Trademarks*